(12) United States Patent
Nam et al.

(10) Patent No.: US 12,105,154 B2
(45) Date of Patent: Oct. 1, 2024

(54) CURRENT PROTECTION SYSTEM FOR ENERGY STORAGE SYSTEM

(71) Applicant: SAMSUNG SDI CO., LTD., Yongin-si (KR)

(72) Inventors: Hyung Kyu Nam, Yongin-si (KR); Hyun Soon Lee, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 121 days.

(21) Appl. No.: 17/136,619

(22) Filed: Dec. 29, 2020

(65) Prior Publication Data

US 2021/0239767 A1 Aug. 5, 2021

(30) Foreign Application Priority Data

Jan. 30, 2020 (KR) .................... 10-2020-0011185

(51) Int. Cl.
| | |
|---|---|
| *G01R 31/396* | (2019.01) |
| *G01R 19/10* | (2006.01) |
| *G01R 31/3832* | (2019.01) |
| *H01M 10/42* | (2006.01) |

(52) U.S. Cl.
CPC ........... *G01R 31/396* (2019.01); *G01R 19/10* (2013.01); *G01R 31/3832* (2019.01); *H01M 10/425* (2013.01); *H01M 2010/4271* (2013.01)

(58) Field of Classification Search
CPC .. G01R 31/396; G01R 31/3832; G01R 31/52; G01R 31/382; G01R 19/10; G01R 1/203; H01M 10/425; H01M 2010/4271; Y02E 60/10; H02J 7/0031; H02J 7/00304; H02J 7/00306

See application file for complete search history.

(56) References Cited

U.S. PATENT DOCUMENTS

| | | |
|---|---|---|
| 8,643,332 B2 | 2/2014 | Yokotani |
| 9,065,296 B2 | 6/2015 | Shim |

(Continued)

FOREIGN PATENT DOCUMENTS

| | | | |
|---|---|---|---|
| CN | 108321775 A | * 7/2018 | ............... H02H 3/26 |
| JP | H9-261843 A | 10/1997 | |

(Continued)

OTHER PUBLICATIONS

European Search Report dated May 7, 2021.
Korean Office action dated May 21, 2021.
Japanese Office action dated Jan. 17, 2022.

*Primary Examiner* — Catherine T. Rastovski
*Assistant Examiner* — Lal C Mang
(74) *Attorney, Agent, or Firm* — Lee IP Law, P.C.

(57) ABSTRACT

A current protection system for an energy storage system includes: batteries connected in parallel; battery control units respectively connected to the batteries, and respectively having battery current measurement units; a battery connection panel connecting the battery control units to one connection point, the battery connection panel having a contact point current measurement unit; and a control unit configured to sum current values respectively measured by the battery current measurement units and a current value measured by the contact point current measurement unit, and to detect a presence of an internal short circuit based on the sum.

6 Claims, 7 Drawing Sheets

(56) References Cited

U.S. PATENT DOCUMENTS

| | | | |
|---|---|---|---|
| 2010/0072950 A1* | 3/2010 | Tatebayashi | H02J 7/00 |
| | | | 320/134 |
| 2011/0140648 A1* | 6/2011 | Lee | H02J 7/00 |
| | | | 320/101 |
| 2011/0294015 A1* | 12/2011 | Pirk | H01M 2/14 |
| | | | 429/246 |
| 2011/0296218 A1* | 12/2011 | Kim | G06F 1/32 |
| | | | 713/323 |
| 2012/0182021 A1 | 7/2012 | McCoy et al. | |
| 2012/0235483 A1* | 9/2012 | Rigby | H02J 7/00 |
| | | | 307/29 |
| 2016/0211684 A1 | 7/2016 | Tsurumaru et al. | |
| 2017/0054134 A1 | 2/2017 | Choi et al. | |
| 2017/0201103 A1 | 7/2017 | Jeon et al. | |
| 2019/0386350 A1 | 12/2019 | Sato | |
| 2020/0127339 A1* | 4/2020 | Nakano | H01M 10/44 |

FOREIGN PATENT DOCUMENTS

| | | | | |
|---|---|---|---|---|
| JP | 2011-135656 A | 7/2011 | | |
| JP | 5251413 B2 * | 7/2013 | | H02M 7/48 |
| JP | 2015-192493 A | 11/2015 | | |
| JP | 2018-148726 A | 9/2018 | | |
| KR | 10-2013-0068308 A | 6/2013 | | |
| KR | 10-2013-0112739 A | 10/2013 | | |
| KR | 10-2017-0022417 A | 3/2017 | | |
| KR | 10-2017-0084608 A | 7/2017 | | |
| KR | 10-1901680 B1 | 9/2018 | | |
| WO | WO 2015/040725 A1 | 3/2017 | | |

\* cited by examiner

CURRENT PROTECTION SYSTEM FOR ENERGY STORAGE SYSTEM

CROSS-REFERENCE TO RELATED APPLICATION

Korean Patent Application No. 10-2020-0011185, filed on Jan. 30, 2020, in the Korean Intellectual Property Office, and entitled: "Current Protection System for Energy Storage System," is incorporated by reference herein in its entirety.

BACKGROUND

1. Field

Embodiments relate to a current protection system for an energy storage system.

2. Description of the Related Art

An energy storage system quickly charges and discharges large capacity power, and may be provided with one or more functions so that the system can be safely stopped when an accident such as an electric shock, a short circuit, or fire occurs.

The above-described information disclosed in the background is only for improving the understanding of the background of the art, and thus may include information not constituting the prior art.

SUMMARY

Embodiments are directed to a current protection system for an energy storage system, including: batteries connected in parallel; battery control units respectively connected to the batteries, and respectively having battery current measurement units; a battery connection panel connecting the battery control units to one connection point, the battery connection panel having a contact point current measurement unit; and a control unit configured to sum current values respectively measured by the battery current measurement units and a current value measured by the contact point current measurement unit, and to detect a presence of an internal short circuit based on the sum.

When the sum of the current values respectively measured by the battery current measurement units and the current value measured by the contact point current measurement unit is not 0, the control unit may determine that the internal short circuit is present.

When the sum of the current values respectively measured by the battery current measurement units and the current value measured by the contact point current measurement unit is 0, the control unit may determine that the internal short circuit is not present.

When it is determined that the internal short circuit is present, the control unit may generate a trip signal to stop the energy storage system.

A direction of current measured by the contact point current measurement unit may be set to be opposite to a direction of current measured by the battery current measurement units.

The control unit may detect a high resistance short circuit accident according to insulation breakdown of a battery cable.

When a short circuit occurs between the battery connection panel and any one among the plurality of battery control units, a direction of current measured by the contact point current measurement unit may be switched to an opposite direction.

The current protection system may further include a power conditioning system connected to the battery connection panel, the power conditioning system being configured to convert electrical characteristics so as to receive electrical energy from an electricity generation device to charge the battery, or to emit energy stored in the battery to an electric power system.

The battery current measurement units and the contact point current measurement unit may be formed of shunt resistors.

BRIEF DESCRIPTION OF THE DRAWINGS

Features will become apparent to those of skill in the art by describing in detail example embodiments with reference to the attached drawings in which.

DETAILED DESCRIPTION

Figure 1:
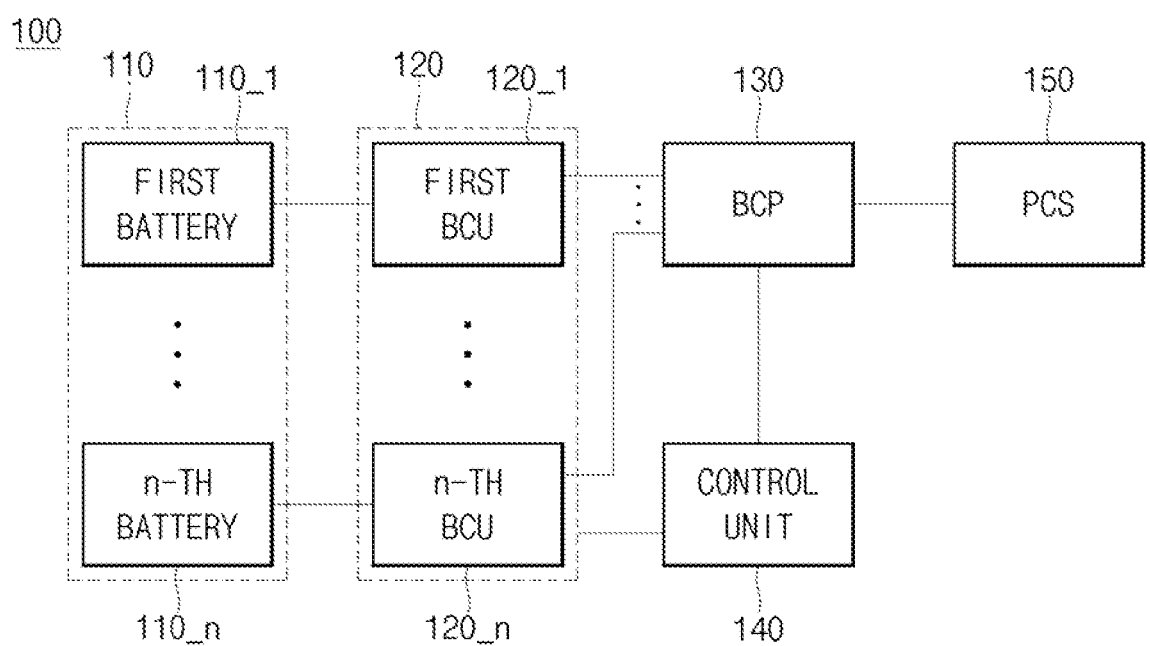
FIG. 1 is a block diagram illustrating a current protection system for an energy storage system according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the listed items. In addition, it will be understood that when an element A is referred to as being "connected to" an element B, the element A can be directly connected to the element B or an intervening element C may be present and the element A and the element B are indirectly connected to each other.

The terminology used herein is for the purpose of describing particular embodiments only and is not intended to be limiting of the disclosure. As used herein, singular forms, unless contextually defined otherwise, may include plural forms. Also, the terms "comprise" and/or "comprising" are used herein to specify the present of stated shapes, numbers, steps, operations, members, elements, and/or groups thereof but do not preclude the presence or addition of one or more other shapes, numbers, operations, members, elements and/or groups thereof.

Figure 2:
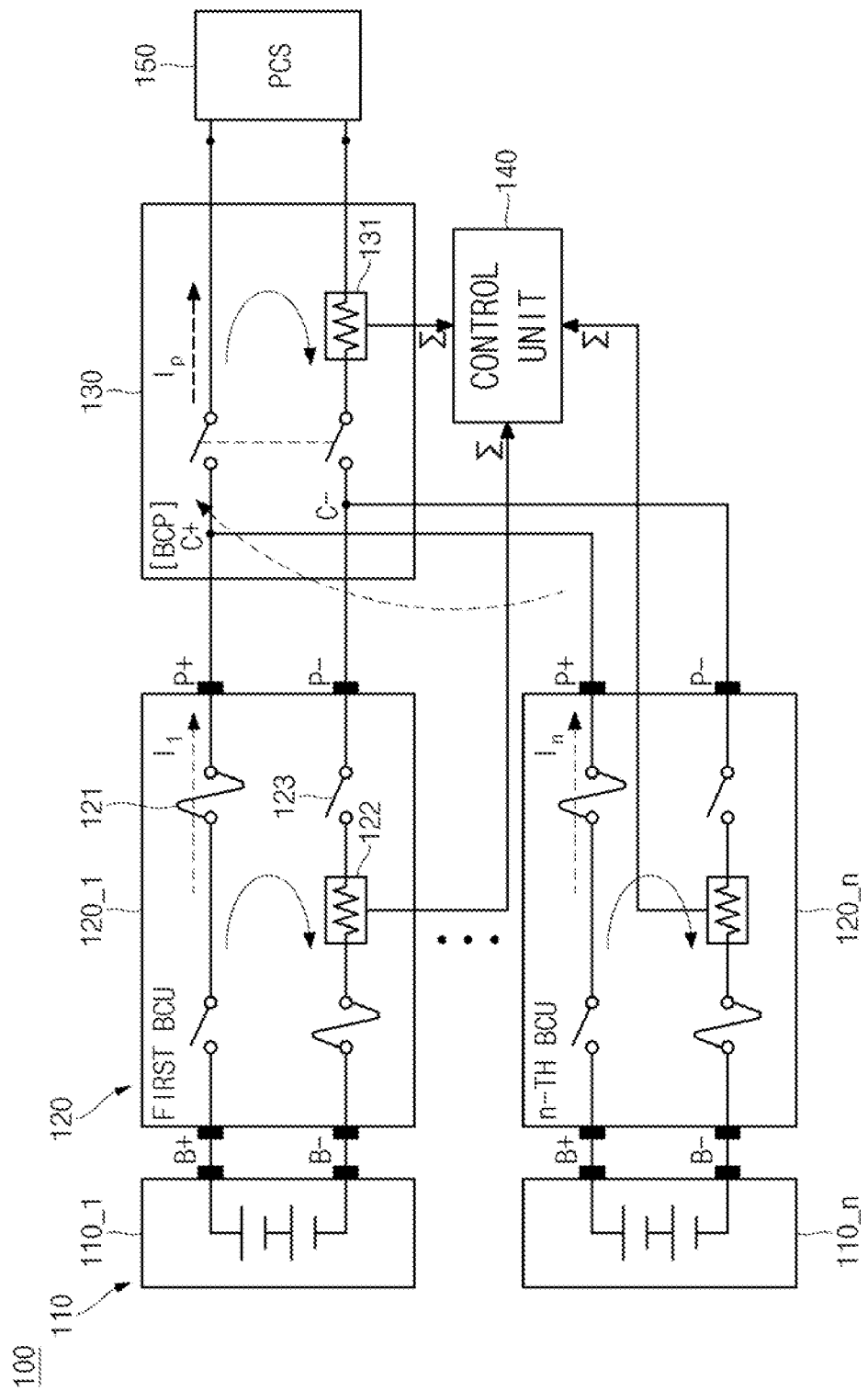
FIG. 2 is a circuit diagram illustrating a current protection system for an energy storage system according to an example embodiment.

FIG. 1 is a block diagram illustrating a current protection system for an energy storage system according to an example embodiment. FIG. 2 is a circuit diagram illustrating a current protection system for an energy storage system according to an example embodiment.

Referring to FIG. 1, a current protection system 100 according to an example embodiment may include a plurality of batteries 110, a plurality of battery control units (BCUs) 120, a battery connection panel (BCP) 130, a control unit 140, and a power conditioning system (PCS) 150.

The plurality of batteries 110 may be connected in parallel. Each of the batteries 110 may be formed of a plurality of battery cells connected in series and/or parallel. The plurality of batteries 110 may include a first battery to an n-th battery 110_1 to 110_n. For the sake of explanation, the battery 110 will be described using an example in which 50 batteries 110_1 to 110_50 are connected in parallel.

The battery control units 120 may be respectively connected which monitor the states of the batteries 110, and control charging and discharging of the batteries 110. Thus, the number of the battery control units 120 may be the same as that of the batteries 110, and the plurality of battery control units 120 may include a first battery control unit to an n-th battery control unit 120_1 to 120_n.

The plurality of battery control units 120 may each have the same structure. Thus, for the sake of explanation, only a first battery control unit 120_1 will be described in detail. In addition, for convenience, the first battery control unit 120_1 may be referred to as a battery control unit 120.

Referring to FIG. 2, the battery control unit 120 may include a fuse 121, and a battery current measurement unit 122, and a DC contactor 123.

The battery control unit 120 may include at least one fuse 121 to be cut to protect the battery 110, when the current flowing through the battery 110 is equal to or greater than a set current due to an overcurrent or a short circuit, etc.

The battery current measurement unit 122 may measure a value and determine a direction of current flowing through the battery 110, and provide the measured current value and determined current direction to the control unit 140. For example, the battery current measurement unit 122 may include or be formed of a shunt resistor.

The battery current measurement unit 122 may detect a direction from a minus terminal C− of the battery connection panel 130 to a minus terminal B− of the battery 110 as a forward direction or a first direction, and may detect a direction from the minus terminal B− of the battery 110 to the minus terminal C− of the battery connection panel 130 as a reverse direction or a second direction.

The battery 110 and the battery control unit 120 may be referred to together as a battery pack. A plurality of the battery packs may be connected in parallel to the battery connection panel 130.

The battery connection panel 130 may be electrically connected to each of the plurality of battery control units 120. The battery connection panel 130 may bind the plurality of battery packs to one connection point. For example, plus terminals P+ of the plurality of battery control units 120 may all be electrically connected to a plus terminal C+ of the battery connection panel 130, and minus terminals P− of the plurality of battery control units 120 may all be electrically connected to the minus terminal C− of the battery connection panel 130.

The battery connection panel 130 may include a contact point current measurement unit 131. The contact point current measurement unit 131 may measure a value of the current and determine a direction of the current flowing through the battery connection panel 130, and provide the measured value and current direction to the control unit 140. For example, the contact point current measurement unit 131 may include or be formed of a shunt resistor.

The contact point current measurement unit 131 may detect a direction from the minus terminal C− of the battery connection panel 130 to a minus terminal of the power conditioning system 150 as a forward direction or a first direction, and detect a direction from the minus terminal of the power conditioning system 150 to the minus terminal C− of the battery connection panel 130 as a reverse direction or a second direction. Thus, the current direction measured by the contact point current measurement unit 131 in the battery connection panel 130 may be set to be opposite to that measured by the battery current measurement unit 122 in the battery control unit 120. Accordingly, the current direction measured by the contact point current measurement unit 131 in the battery connection panel 130 may be measured opposite to the direction of the current actually flowing through the battery connection panel 130, and thus may have an opposite sign.

The control unit 140 may be connected to the plurality of the battery control units 120 and the battery connection panel 130 to determine an internal short circuit (or an abnormal state) between the battery control units 120 and the battery connection panel 130. The control unit 140 may receive the current value measured by the battery current measurement unit 122 in each of the battery control units 120, and the current value measured by the contact point current measurement unit 131 in the battery connection panel 130, and may determine whether the internal short circuit occurs or is present.

The following equation is established according to the Kirchhoff's law (KCL) that 'the sum of currents at a node is 0'.

$$\sum_{n=1}^{n} I_n - I_p = 0$$

$I_1$ to $I_n$, and $I_p$ are illustrated in FIG. 2. It is assumed that the incoming direction of the current on the basis of the node is '+', and the outgoing direction of the current is '−'. The node in FIG. 2 indicates a point at which the plurality of battery packs and the battery connection panel 130 meet.

The control unit 140 may sum the current value measured by each of the battery current measurement unit 122 and the current value measured by the contact point current measurement unit 131 to determine whether there occurs the internal short circuit. In a normal state, referring to FIG. 2, the current measured at the contact point current measurement unit 131 is $-I_p$, because the current direction measured at the contact point current measurement unit 131 is set opposite to that measured by the battery current measurement unit 122. This may be interpreted to have the same meaning as that the current outgoing from the node is considered as (−) in Kirchhoff's law.

In an example embodiment, when the sum of the current values respectively measured by the battery current measurement units 122 and the current value measured at the contact point current measurement unit 131 is 0, the control unit 140 may determine that the current protection system 100 is in a normal state because current vectors of both sides are parallel on the basis of the node. In addition, when the sum of the current values respectively measured by the battery current measurement units 122 and the current value measured at the contact point current measurement unit 131 is not 0, the control unit 140 may determine that the current vectors are on one side, thus indicating an internal short circuit. Accordingly, the control unit 140 may generate a trip signal to stop the current protection system 100 for the energy storage system.

The power conditioning system (PCS) 150 may be connected to the battery connection panel 130, and may receive electrical energy from an electric power system or a power generation device (such as a renewable energy source) to perform conversion the electrical characteristics (AC/DC, voltage, frequency, or the like) in order to charge the battery 110. or in order to provide the energy stored in the battery 110 to the outside.

In an example embodiment, the control unit 140 may determine whether the internal short circuit occurs, may distinguish a disturbance such as a temporary temperature change or surge from a short circuit accident, and may reduce a gray zone between the short circuit and overcurrent to allow protection coordination between functions. Accordingly, the present example embodiment may reduce a non-operation time of the energy storage system and enhance efficiency.

Figure 3:
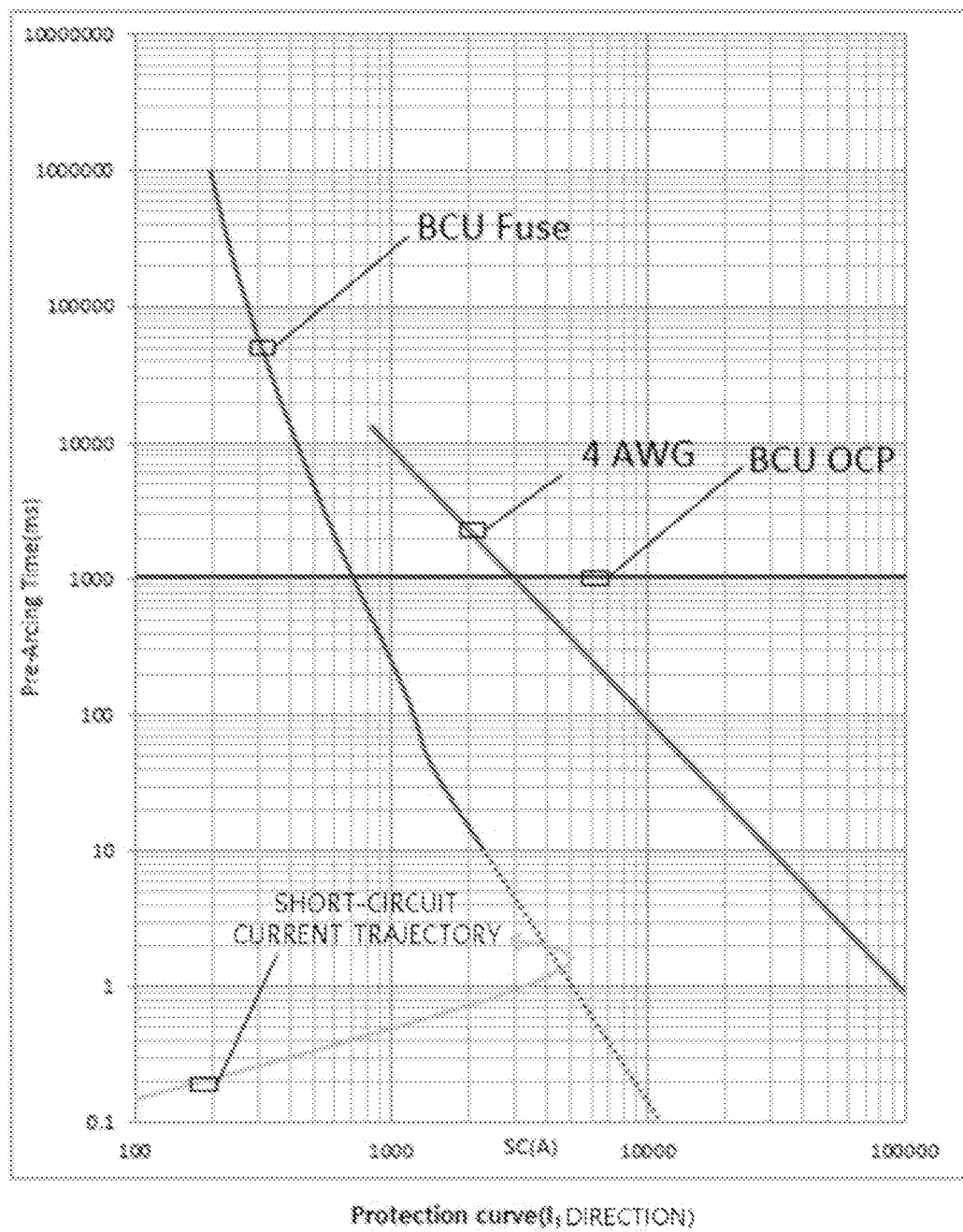
FIG. 3 is a graph showing fuse melting and power cable breakdown according to a current in an $I_1$ direction and time as logarithmic functions.
Figure 4:
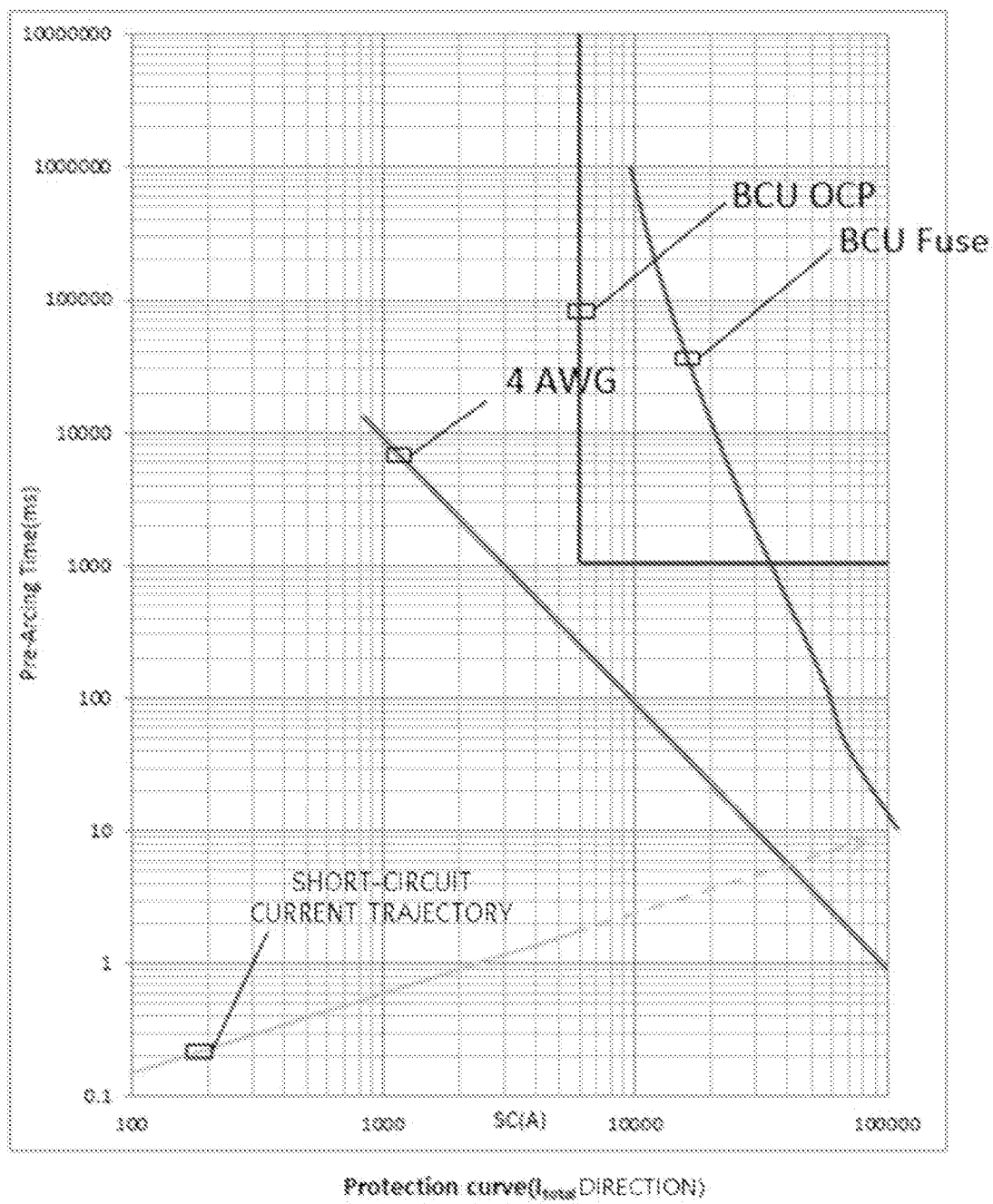
FIG. 4 is a graph showing fuse melting and power cable breakdown according to a current in an $I_{total}$ direction and time as logarithmic functions.

FIG. 3 is a graph showing fuse melting and power cable breakdown according to a current in an $I_1$ direction and time as logarithmic functions. FIG. 4 is a graph showing fuse melting and power cable breakdown according to a current in an $I_{total}$ direction and time as logarithmic functions.

In general, a fuse or a current meter may be used to protect a system from an overcurrent or a short-circuit current in an energy storage system. The short circuit accident due to the overcurrent and the short-circuit current may be distinguished according to the magnitude of a resistance at a fault point, e.g., as the magnitude of the resistance becomes smaller, the fault current becomes large, and the case in which a current greater than ten times the typical continuous current rating flows may be defined as a short circuit. However, in a multi-parallel battery configuration as in the previously-described example embodiment, a protection coordinate for the short-circuit current and the overcurrent may not be desirable, and thus a gray zone may exist. The gray zone will be described in detail with reference to FIGS. 3 and 4.

FIG. 3 illustrates a current-time (I-T) curve from the perspective of $I_1$.

In FIG. 3, a curve 'BCU Fuse' shows an operation of a fuse according to the magnitude of the current $I_1$ generated in the battery control unit 120. On the basis of the BCU Fuse curve, the left side is the gray zone, and the right side is a protection zone. Specifically, when the trajectory of the short-circuit current flowing through the battery control unit 120 enters the protection zone of the BCU Fuse curve, the fuse is melted to block the short-circuit current. On the other hand, when the trajectory of the short-circuit current remains in the gray zone, the battery control unit 120 is not isolated by the fuse.

In FIG. 3, a curve '4 AWG' shows a short-circuit strength curve of a battery power cable, wherein the left side is a safety zone, and the right side is an insulation breakdown zone.

In FIG. 3, a curve 'BCU OCP' (overcurrent protection=OCP) is a curve of an overcurrent protection device, wherein the lower side is a non-protection zone, and the upper side is a protection zone.

Thus, according to the graphs of FIG. 3, the protection coordination is performed among the BCU Fuse, the power cable, and the BCU overcurrent protection device. Thus, when a short-circuit accident occurs, the short-circuit current enters the protection zone of the BCU Fuse along the trajectory of the short-circuit current to be blocked by the fuse.

FIG. 4 illustrates the I-T curve from the perspective of $I_{total}$, where $I_{total}$ is the sum of $I_a$ and $I_p$, $I_a$ is the sum of the currents of 49 BCUs, and $I_p$ means the current of the BCP.

In FIG. 4, the curve '4 AWG' is for a power cable at a short circuit accident point, and is the same as that in FIG. 3.

In addition, FIG. 4 is viewed in perspective of $I_{total}$, where the BCU OCP curve is the sum of curves of 49 overcurrent protection devices, and the BCU Fuse is the sum of 49 fuses.

Accordingly, the BCU Fuse curve in FIG. 4 is positioned further to the right side than the 4 AWG curve. Thus, in the perspective of $I_{total}$, since the 4 AWG curve is positioned further to the left side than the BCU Fuse curve, when a short-circuit accident occurs, cable insulation breakdown may occur which is not protected according to the $I_{total}$ current.

From the above, it will be understood that example embodiments may enhance safety by including the control unit 140 in order to prevent a high resistance short-circuit accident corresponding to the non-protection area between an overcurrent and the short-circuit accident. The control unit 140 may compare the current values respectively measured by the battery current measurement units 122 in the battery control units 120, and the current value measured by the contact point current measurement unit 131 in the battery connection panel 130, and may determine whether the short circuit occurs. Specifically, when the sum of the current values respectively measured by the battery current measurement units 122 and the current value measured by the contact point current measurement unit 131 is 0, the control unit 140 may determine that the current protection system 100 is in a normal state or that an internal short circuit is not present. In addition, when the sum of the current values respectively measured by the battery current measurement units 122 and the current value measured at the contact point current measurement unit 131 is not 0, the control unit 140 may determine that the short circuit accident occurs. This is because the current direction of the contact point measurement unit 131 is set opposite to that of the battery current measurement unit 122. Thus, when the sum of the current values respectively measured by the battery current measurement units 122 and the current value measured at the contact point current measurement unit 131 is 0 and the current vectors of both sides are made parallel the control unit 140 may determine the normal state. On the other hand, when a short circuit occurs between the battery connection panel 130 and any one among the plurality of battery control units 120, the direction of the current flowing through the battery connection panel 130 may be changed. Accordingly, when the sum of the current values respectively measured by the battery current measurement units 122 and the current value measured at the contact point current measurement unit 131 becomes greater than 0 and the current vectors are on one side, the control unit 140 may determine that the short circuit accident occurs.

Figure 5:
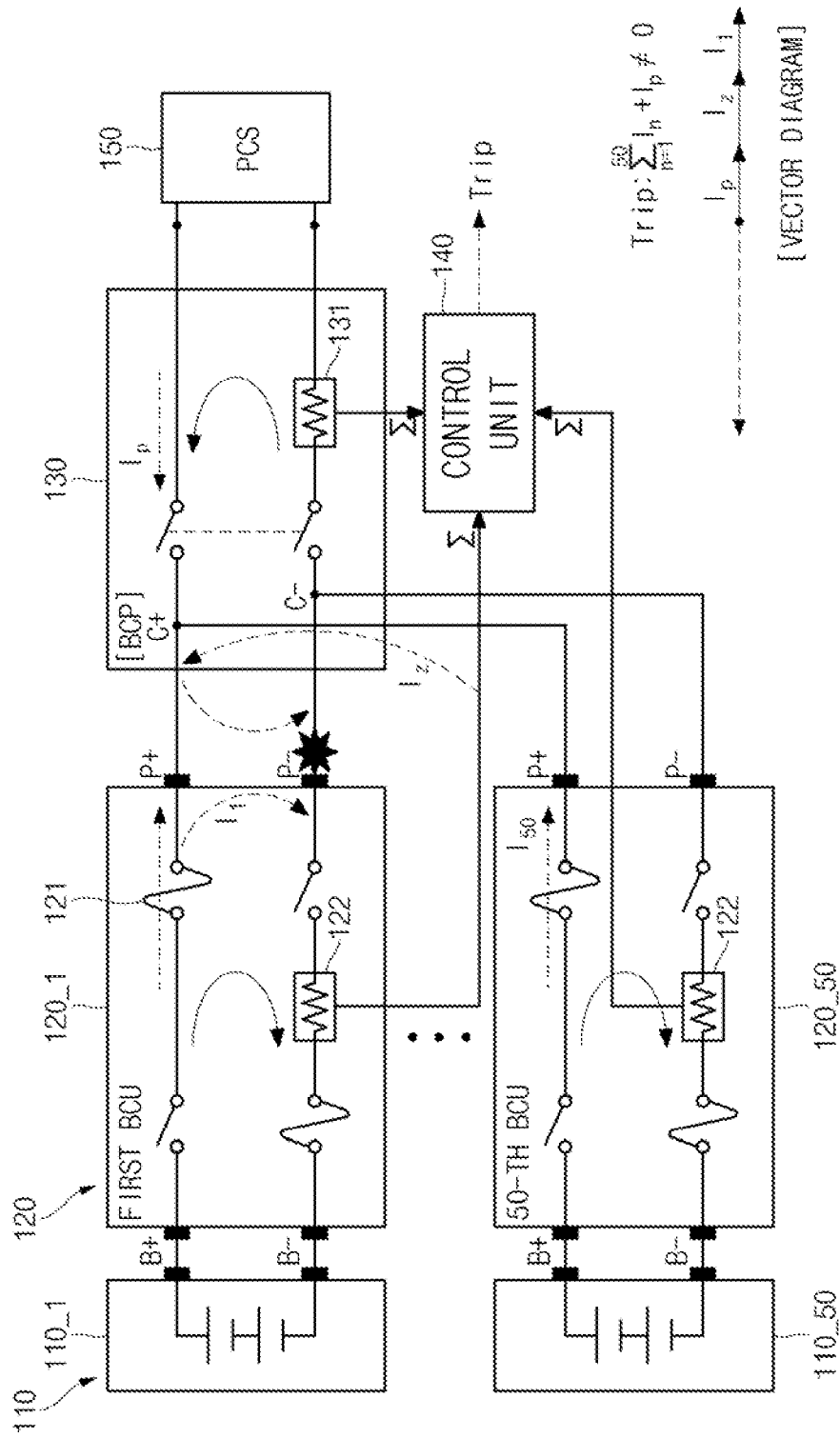
FIG. 5 is a circuit diagram illustrating a state in which an internal accident occurs in a current protection system for an energy storage system according to an example embodiment.
Figure 6:
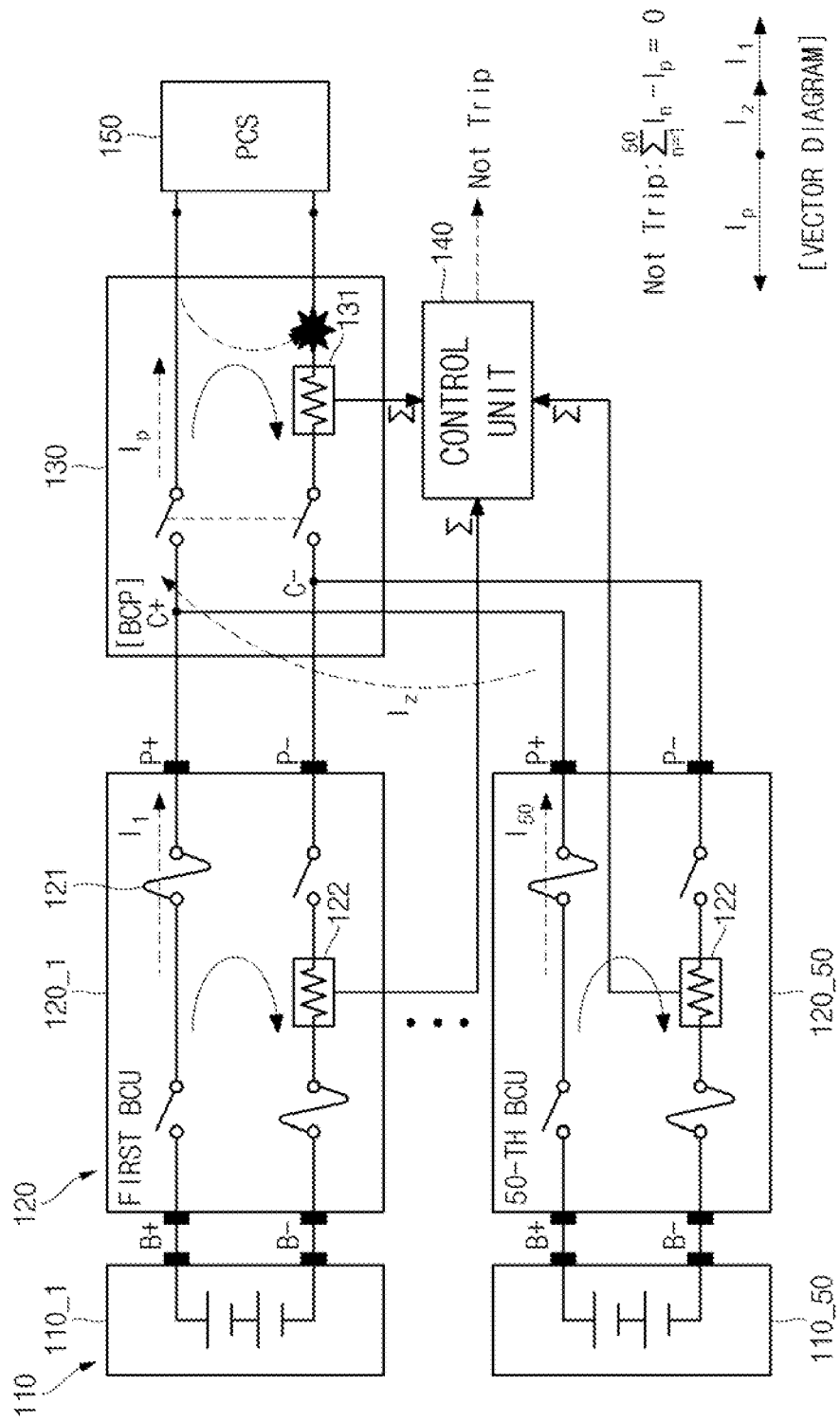
FIGS. 6 and 7 are circuit diagrams illustrating a state in which an external accident occurs in a current protection system for an energy storage system according to an example embodiment.
Figure 7:
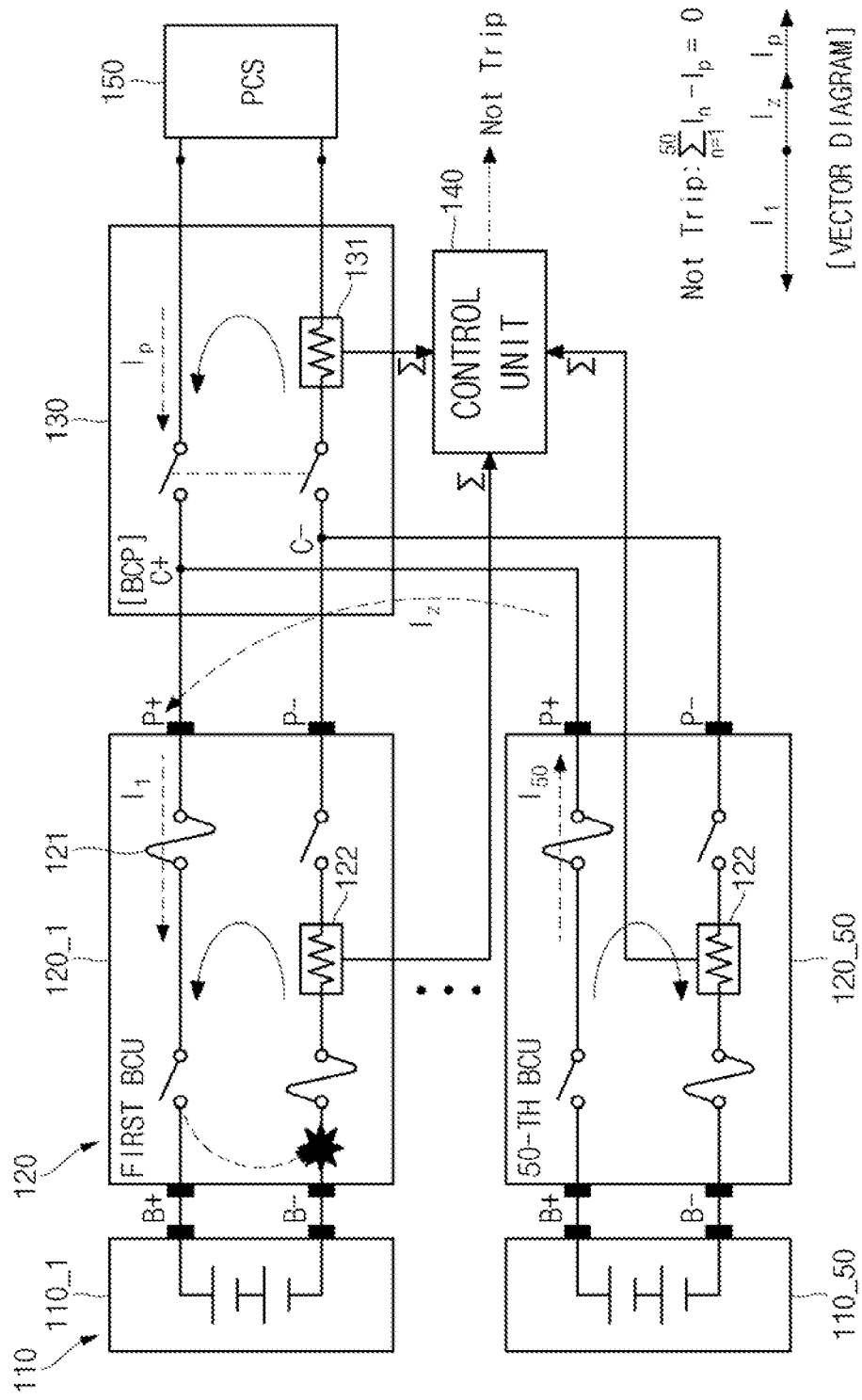

FIG. 5 is a circuit diagram illustrating a state in which an internal accident occurs in a current protection system for an energy storage system according to an example embodiment, and FIGS. 6 and 7 are circuit diagrams illustrating a state in which an external accident occurs.

With reference to FIG. 5, a description will be provided about a method for the control unit 140 to determine whether a short circuit occurs when a short circuit accident occurs between the first battery control unit 120_1 and the battery connection panel 130.

When the short circuit accident occurs between the first battery control unit 120_1 and the battery connection panel 130, the current $I_1$ flowing through the first battery control unit 120_1 flows to the short circuit point. Here, the current in the first battery control unit 120_1 flows in the same forward direction (first direction) as before the short circuit. The currents in the second to 50th battery control units 120_2 to 120_50, in which the short circuits do not occur, flow in the same forward direction (first direction) as before the short circuit. On the other hand, the current $I_p$ flowing through the battery connection panel 130 flows to the short circuit point in the forward direction (first direction) that is opposite to before the short circuit. The control unit 140 receives the currents measured by the respective battery current measurement units 122 and the current measured by the contact point current measurement unit 131. Here, the direction of the current measured by the contact point current measurement unit 131 is changed to be opposite to that before the short circuit and measured as $I_p$. Accordingly, since the sum of the current values respectively measured by the battery current measurement units 122 and the current value measured by the contact point current measurement unit 131 is not 0 (as shown in the following Equation), the control unit 140 determines that the internal short circuit occurs.

$$\sum_{n=1}^{50} I_n + I_p \neq 0$$

In this case, the control unit 140 may generate a trip signal to stop the system. The control unit 140 may compare the current values respectively measured by the battery current measurement units 122 to determine that the short circuit occurs in the first battery control unit 120_1, which has the largest current value. In the vector diagram shown in FIG. 5, $I_z$ is the sum of the currents of the second to 50th battery control units 120_2 to 120_50 in which the short circuit does not occur. The equation applied with the same will be represented as the following Equation.

$$I_1 + I_z + I_p \neq 0$$

Meanwhile, the control unit 140 does not generate a trip signal when the system is in a normal state, or when an external accident occurs. Here, the external accident means an accident occurring between the battery 110 and the battery control units 120 and between the battery connection panel 130 and the power conditioning system 150, rather than between the battery connection panel 130 and the battery control units 120.

With reference to FIG. 6, a description will be provided about a method for the control unit 140 to determine whether a short circuit occurs when a short circuit accident occurs between the battery connection panel 130 and the power conditioning system 150.

When the short circuit accident occurs between the battery connection panel 130 and the power conditioning system 150, the currents $I_1$ to $I_{50}$ flowing through the first battery control unit to the 50th battery control unit 120_1 to 120_50 flow to the short circuit point. Here, the currents of the respective battery control units 120 flow in the same forward direction (first direction) as before the short circuit. The current $I_p$ flowing through the battery connection panel 130 also flows to the short circuit point in the reverse direction (second direction) that is same as before the short circuit. The control unit 140 receives the currents measured by the respective battery current measurement units 122 and the current measured by the contact point current measurement unit 131. As represented by the following Equation, since the sum of the current values respectively measured by the battery current measurement units 122 and the current value measured by the contact point current measurement unit 131 is 0, the control unit 140 determines that the internal short circuit does not occur.

$$\sum_{n=1}^{50} I_n - I_p = 0$$

Alternatively, this may be represented as follows:

$$I_1 + I_z - I_p = 0$$

Accordingly, the control unit 140 does not start system blocking. Instead, for the aforementioned external accident, the current is blocked by the fuse of the power conditioning system 150 to stop the system.

With reference to FIG. 7, a description will be provided about a method for the control unit 140 to determine whether a short circuit occurs when a short circuit accident occurs between the first battery 110_1 and the battery control unit 120_1.

When the short circuit accident occurs between the first battery 110_1 and the battery control unit 120_1, the current $I_1$ flowing through the first battery control unit 120_1 flows to the short circuit point. Here, the current of the first battery control unit 120_1 flows in the reverse direction (second direction), which is opposite to before the short circuit. The currents of the second to 50th battery control units 120_2 to 120_50, in which the short circuit does not occur, flow in the same forward direction (first direction) as before the short circuit. The current $I_p$ flowing through the battery connection panel 130 flows to the short circuit point in the forward direction (first direction) that is opposite to before the short circuit. The control unit 140 receives the currents measured by the respective battery current measurement units 122 and the current measured by the contact point current measurement unit 131. As shown by the vector diagram of FIG. 7, since the sum of the current values respectively measured by the battery current measurement units 122 and the current value measured by the contact point current measurement unit 131 is 0, the control unit 140 determines that the internal short circuit does not occur.

$$-I_1 + I_z + I_p = 0$$

Accordingly, the control unit 140 does not start system blocking. Instead, for the aforementioned external accident, the current may be blocked by another protection device to stop the system. For example, the current from the battery 110 may be blocked by a module fuse (not shown) mounted in the battery 110, and the current flowing through the first battery control unit 120_1 may be blocked by the fuse 121 of the first battery control unit 120_1.

By way of summation and review, a representative safety function is an overload protection function. The overload protection function may operate in a manner in which the magnitude of a current supplied to the facility is sensed to determine whether there is an abnormality. For example, a current meter may be used to measure an electrical current in real time. When the measurement value exceeds a preset value, a battery may be protected from overdischarge by operating a switchgear to stop the system. Further, a fuse may be used, and when a short circuit occurs (such as from a dielectric breakdown), the fuse may stop a short circuit current to protect the system.

As described above, embodiments may provide a current protection system for an energy storage system, which may enhance the safety and efficiency by detecting and blocking a high-resistance short circuit accident such as dielectric breakdown of a cable within a fast time. Embodiments may detect a high resistance short accident to enhance the safety and efficiency, and may including a control unit that calculates the sum of current values respectively measured by battery current measurement units and a current value measured by a contact point current measurement unit to determine whether an internal short circuit occurs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A current protection system for an energy storage system, comprising:
    batteries connected in parallel;
    battery control units, each battery control unit having at least one fuse and at least one battery current measurement unit, the battery control units respectively connected to the batteries;
    a battery connection panel connecting the battery control units to one connection point, the battery connection panel having a contact point current measurement unit;
    a control unit configured to sum first current values respectively measured by the battery current measurement units at a negative terminal of the battery connection panel and a second current value measured by the contact point current measurement unit at the negative terminal of the battery connection panel, and to detect a presence of an overcurrent or an internal short circuit based on the sum, wherein the control unit detects a high resistance internal short circuit according to insulation breakdown of a battery cable, wherein the control unit detects the insulation breakdown based on a short circuit strength curve and a battery control unit fuse curve on a graph of time on a Y axis of the graph and current on an X axis of the graph, and wherein the insulation breakdown occurs at a right side of the short circuit strength curve if the battery control unit fuse curve is to a left of the short circuit strength curve; and
    a power conditioning system connected to the battery connection panel, the power conditioning system being configured to convert electrical characteristics so as to receive electrical energy from an electricity generation device to charge the battery, or to emit energy stored in the battery to an electric power system, wherein the internal short circuit is located in the current protection system at a location other than a battery, and wherein when the presence of an overcurrent or an internal short circuit is detected by the control unit, the control unit generates a trip signal to melt the at least one fuse to block the overcurrent or short-circuit current to stop the energy storage system.

2. The current protection system as claimed in claim 1, wherein, when the sum of the current values respectively measured by the battery current measurement units and the current value measured by the contact point current measurement unit is not 0, the control unit determines that the internal short circuit is present.

3. The current protection system as claimed in claim 1, wherein, when the sum of the current values respectively measured by the battery current measurement units and the current value measured by the contact point current measurement unit is 0, the control unit determines that the internal short circuit is not present.

4. The current protection system as claimed in claim 1, wherein a direction of current measured by the contact point current measurement unit is opposite to a direction of current measured by the battery current measurement units.

5. The current protection system as claimed in claim 1, wherein, when an internal short circuit occurs between the battery connection panel and any one among the plurality of battery control units, a direction of current measured by the contact point current measurement unit is switched to an opposite direction.

6. The current protection system as claimed in claim 1, wherein the battery current measurement units and the contact point current measurement unit are formed of shunt resistors.

* * * * *